United States Patent [19]

Forster et al.

[11] 4,340,260

[45] Jul. 20, 1982

[54] MAGNETIC SUSPENSION BEARING

[75] Inventors: Helmut Forster, Neunkirchen; Paul Hini, Kosbach; Gerd Stransky, Alzenau, all of Fed. Rep. of Germany

[73] Assignee: Siemens Aktiengesellschaft, Munich, Fed. Rep. of Germany

[21] Appl. No.: 184,474

[22] Filed: Sep. 5, 1980

[30] Foreign Application Priority Data

Sep. 25, 1979 [DE] Fed. Rep. of Germany ....... 2938809

[51] Int. Cl.³ ............................................ F16C 39/06
[52] U.S. Cl. ................................ 308/10; 324/154 PB
[58] Field of Search ....... 308/10; 324/151 R, 154 PB; 361/143, 146

[56] References Cited

U.S. PATENT DOCUMENTS 3,888,553  6/1975  Wehde ................................. 308/10
3,899,223  8/1975  Baermann ........................... 308/10

FOREIGN PATENT DOCUMENTS 1472413  1/1969  Fed. Rep. of Germany ........ 308/10
2134424  1/1973  Fed. Rep. of Germany ........ 308/10
 391091  8/1965  Switzerland ........................ 308/10

Primary Examiner—R. Skudy
Attorney, Agent, or Firm—Kenyon & Kenyon

[57] ABSTRACT

A magnetic suspension bearing for a rotating body having at least two magnet systems of coaxial permanent magnets arranged sequentially along the axis of rotation of the rotating body. Each magnet system is provided with two permanent magnets disposed on the rotating body and a stator, respectively. Each such permanent magnet is magnetized in a direction perpendicular to a major external surface, the adjacent surfaces of the magnets within a magnet system being of like polarity so as to repel one another. Each of the magnets is constructed so as to form a truncated cone, the axis of which coincides with an axis of rotation of the rotating body. In one embodiment, the apex of the cones are directed towards one another. The apex angle of the cones is advantageously preselected to provide desired axial and orthogonal components of force.

4 Claims, 1 Drawing Figure

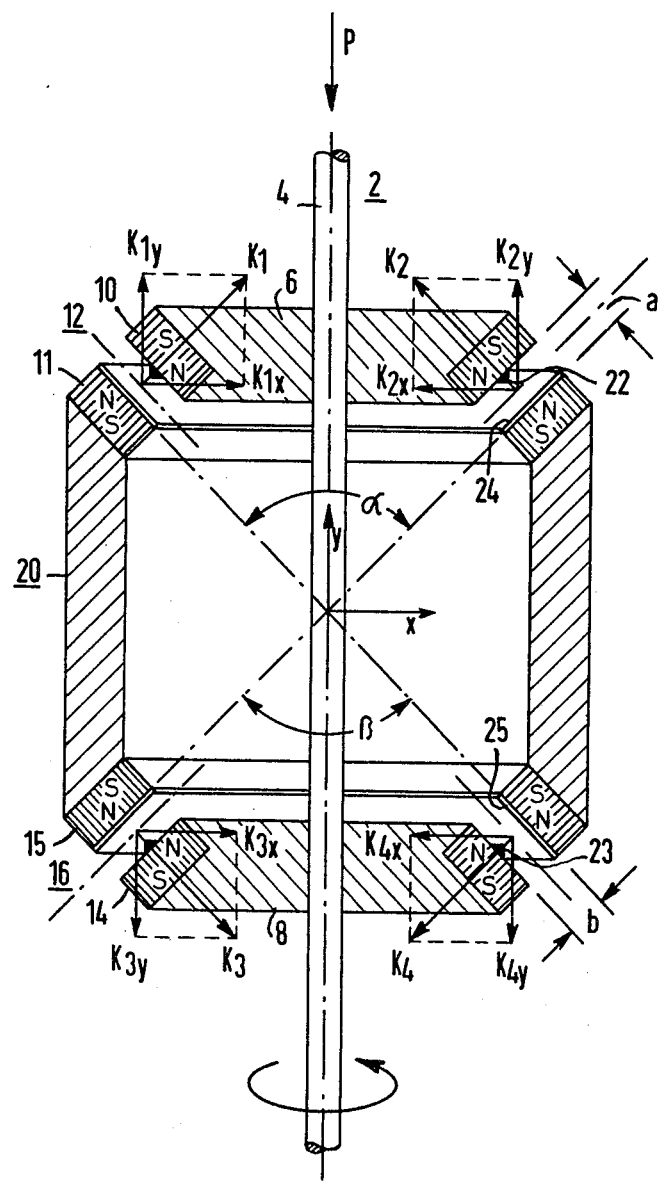

MAGNETIC SUSPENSION BEARING

BACKGROUND OF THE INVENTION

This invention relates to magnetic suspension bearings, and more particularly to a magnetic suspension bearing for supporting a rotatable body and having two annular magnet assemblies which are axially aligned and magnetically poled so as to repel one another.

Known applications of magnetic bearings include the support of the rotor shaft of a watt-hour meter, the weight of which shaft and associated rotating bodies connected thereto being partially or completely compensated by magnetic fields. In the case of partial weight compensation, the pressure applied by the end of the shaft to a support bearing is reduced. In cases of complete weight compensation, the shaft is suspended in position by magnetic force. One known design of a magnetic suspension bearing for a vertical shaft contains a plurality of magnet systems arranged sequentially, one behind the other along the axis of rotation of the shaft. Each such magnet system has two coaxially arranged magnets which are magnetized radially, and poled so as to repel one another. Magnetic repulsion forces which are directed perpendicularly to the axis of rotation of the shaft constitute the forces which guide the shaft during rotation. The shaft is held in position so as not to move along an axial direction by separate stabilizing systems. One known stabilizing system utilizes the magnetic flux produced by a controllable electromagnet which acts upon a diamagnetic body connected to the shaft. Such a system is described in German Patent DE-AS No. 1 472 413.

In one known electromagnetic system which combines support and guidance functions, an armature bar which functions as the return path for an electromagnet, is disposed so as to be inclined with respect to the horizon. The resulting inclined position of the air gap produces a magnetic repulsion force which has components of force in the vertical and horizontal directions. In such an arrangement, the force component along the vertical direction serves as the holding force, and the force component along the horizontal direction serves as the guiding force. If the sum of all guiding forces is zero, the movable portion of the system is suspended within the stationary portion. Several electromagnets are arranged so as to be one behind the other along the direction of motion. The angle of inclination of the armature bars is chosen so that the individual electromagnets generate guiding forces alternatingly in opposite directions. Forces acting upon the moving body which are external to the system are compensated by corresponding changes in the guiding forces. Thus, this system, which is described in German Patent DE-AS No. 2 134 424, requires a sensitive and complex control system for the electromagnets.

It is, therefore, an object of this invention to provide a simple and improved magnetic suspension bearing.

It is a further object of this invention to provide a magnetic suspension bearing which combines magnetic support and guidance systems in such a manner that a rotatable body stably supported in axial and axially perpendicular directions without the need for additional stabilizing systems.

SUMMARY OF THE INVENTION

The foregoing and other objects are achieved by this invention which provides a magnetic suspension bearing for supporting a rotating body, the bearing having magnet systems arranged sequentially along the axis of rotation, each such system having two annular and coaxial permanent magnets which are poled so as to repel one another. The permanent magnets are affixed to the rotating body and to the stator, respectively, and are shaped so as to have substantially flat cross-sections. The magnets are magnetized perpendicularly with respect to their flat sides.

In one embodiment, each magnet is shaped in the form of a truncated cone having an axis which coincides with the axis of rotation of the rotating body, the apex of each such truncated cone being directed at the other. As a result of the inclined arrangement of the pole surfaces, the magnetic repulsion force produces force components parallel to the axial direction, and orthogonal thereto. In one embodiment wherein the sum of the support forces and the sum of the guiding forces are zero, the rotating body is held so as to be suspended in the stator. The air gaps may be advantageously designed so as to compensate for the weight of the rotating body. In addition, the proportion of axial and orthogonal force components may be advantageously changed by changing the inclination of the pole surfaces of the two magnet systems.

In situations wherein the axis of rotation of the shaft is disposed vertically, or in situations where relatively large external forces are acting upon the rotating body in the axial direction, it may be advantageous to arrange one or more additional magnet system concentrically about the axis of rotation, such magnet systems having an angle of inclination of the pole surfaces so as to provide increased axial support. Alternatively, such pole surfaces may be inclined so as to increase the guiding forces. It should be noted that the rotating body is held in its suspended position with respect to the stator nearly independently of the position of axis of rotation with respect to the horizon. Thus, absent any large external forces, a suspended rotor may be operated by any angle of inclination with respect to the horizon, including vertical and horizontal arrangements.

BRIEF DESCRIPTION OF THE DRAWINGS

Comprehension of the invention is facilitated by reading the following detailed description in conjunction with the annexed drawing, which shows a schematic cross-section representation of an embodiment of a magnetic suspension bearing which operates in accordance with the principles of the invention.

DETAILED DESCRIPTION

The FIGURE shows a rotating body 2 which is provided with a shaft 4 which is affixed to an axially aligned pair of disc-like support bodies 6 and 8. Each of the support bodies 6 and 8 serves as a carrier for a flat, annular magnet 10 and 14, respectively. Magnets 10 and 14, in combination with magnets 11 and 15, which are disposed on a stator 20, form respective magnet systems 12 and 16. The magnets 10 and 11, of magnet system 12, and magnets 14 and 15, of magnet system 16, are magnetized in directions which are perpendicular to their major external surfaces and are each arranged so as to present like, repelling poles of magnetism to their respectively associated magnets within the magnet systems. As shown in the FIGURE, repelling magnetic forces are produced by the adjacency of like magnetic poles, which are designated N and S. Magnets 11 and 15 are affixed to stator 20, which, in this embodiment, is assumed to be stationary. In other embodiments, shaft 4 may be held stationary and stator 20 rotated about the axis of rotation. Alternatively, both portions may be rotated.

The adjacency of magnets 10 and 11, and 14 and 15 produce magnetic forces which are shown by vectors $K_1$ to $K_4$. These vectors are perpendicular to the major external surfaces of the magnets. The force represented by vector $K_1$ is shown to have a force component $K_{1x}$ in the horizontal direction (orthogonal to the axis of rotation) which serves as the guiding force, and a force component $K_{1y}$ in the vertical (axial) direction which serves as the support force for the rotating body 2. Similarly, magnetic force $K_2$ is shown resolved into its horizontal component $K_{2x}$ and its vertical component $K_{2y}$. Force components $K_{1x}$ and $K_{2x}$ are directed horizontally against one another and thereby serve to maintain the rotating body to substantially an axial alignment within stator 20. Magnetic forces $K_3$ and $K_4$ each form a respective vertical component $K_{3y}$ and $K_{4y}$ which oppose the force components $K_{1y}$ and $K_{2y}$. Horizontal force component $K_{3x}$ and $K_{4x}$ serve as guiding forces. Thus, rotating body 2 is in a stable suspended position if the vector sum of the support forces $K_{1y}$ to $K_{4y}$ and the vector sum of the guiding forces $k_{1x}$ to $K_{4x}$ are zero.

The opposing pole surfaces of magnets 10 and 11, and 14 and 15 define portions of truncated cones which share a common axis coincidental with the axis of rotation of rotating body 2. The apex of the cones defined by the upper magnet system 12 point downward, and is indicated in the FIGURE by an aperture angle $\alpha$. The two cones of lower magnet system 16, on the other hand, point with their apex upward, which is indicated in the FIGURE by the aperture angle $\beta$. It should be noted that the magnetic suspension bearing described herein would perform equally well if magnet system 12 were interchanged with magnet system 16 so that the respective apices point away from one another. In such an embodiment, the aperture angle of the upper cone would point upward, and that of the lower cone would point downward.

The inclination of the angle of the pole surfaces with respect to the axis of rotation does not change the amplitude of the magnetic forces $K_1$ to $K_4$. However, such a change in angle would affect the magnitudes of the vertical and horizontal components. If the magnets are inclined so that the aperture angles are increased, the vertical force component $K_{1y}$ to $K_{4y}$ would be increased and the horizontal $K_{1x}$ to $K_{4x}$ would be decreased correspondingly. Such broadened aperture angles would increase the force required to move the rotor axially with respect to the stator. Conversely, if the faces of the magnets are inclined so as to be steeper with respect to the axis of rotation and thereby decreasing the aperture angles, an increase in the guiding forces $K_{1x}$ to $K_{4x}$ would be obtained.

In the embodiment shown in the FIGURE, if a force indicated by P, which may be the weight of the rotor body 2, were to operate upon the rotating body, the body would move vertically downward so as to reduce an air gap distance a between the pole surfaces of magnet system 12, and thereby increase the magnetic forces $K_1$ and $K_2$. Such a force increase causes a corresponding increase in force component $K_{1y}$ and $K_{2y}$, which act as counterforces against the external force P. Simultaneously, an air gap distance b between the pole surfaces of magnet system 16 is increased, thereby resulting in a corresponding decrease of the magnetic forces $K_3$ and $K_4$, with corresponding decrease in the support forces $K_{3y}$ and $K_{4y}$. Thus, rotating body 2 is displaced by only a small distance as a result of external force P.

It may be advantageous in some embodiments to provide additional magnet systems having angles of inclination which are chosen so as to produce either large vertical support components or large horizontal guidance components. Such additional magnet systems may be located either above or below magnet systems 12 and 16 and would serve either as holding systems or guidance for rotating body 2.

In one embodiment of the magnetic suspension bearing wherein shock-like forces P are expected, such forces can be limited by providing spacers 22 and 23 in the air gaps between the permanent magnets of the magnet systems 12 and 16. Such spacers may be formed in the shape of rings and can be affixed on the pole surfaces of the magnets. Moreover, the magnet surface opposite to the one having the spacer disposed thereon may be provided with a cover 24 and 25 of non-magnetic material, which may be a plastic foil, and which serves as a sliding surface and as a damper for shock-like excursions of rotating body 2.

It should be remembered that although the inventive concept disclosed in this application is presented within the context of specific embodiments and applications, these are merely illustrative and persons skilled in the art can generate additional embodiments for applications not mentioned herein without exceeding the scope of this invention.

What is claimed is:

1. A magnetic suspension bearing for a rotating body having an axis of rotation, the bearing having at least first and second magnet systems which are arranged sequentially along the axis of rotation, each magnet system having two annular, coaxially arranged, permanent magnets which are magnetically poled so as to repel one another, one permanent magnet of each magnet system being affixed to the rotating body, and the other to a stator, the magnetic suspension bearing being CHARACTERIZED IN THAT the permanent magnets are each provided with a pole surface which forms a truncated cone having an axis which coincides with the axis of rotation of the rotating body.

2. The magnetic suspension bearing of claim 1 wherein said pole surfaces of the permanent magnets of the first magnet system have an angle of inclination with respect to the axis of rotation which differs from an angle of inclination of said pole surfaces of the permanent magnets of the second magnet system.

3. The magnetic suspension bearing of claim 1 wherein the permanent magnets of each of the first and second magnet systems are separated by respective air gaps and there is further provided a spacer of non-magnetic material disposed in said air gap of a selected one of the first and second magnet systems, said spacer being affixed to one of the permanent magnets of said selected magnet system.

4. The magnetic suspension bearing of claim 4 wherein said spacer is affixed to one of the pole surfaces of the permanent magnets of said selected one of the first and second magnet systems, and the other pole surface of said selected magnet system is provided with a covering of a non-magnetic material.

* * * * *

Disclaimer and Dedication 4,340,260.—*Helmut Forster*, Neunkirchen; *Paul Hini*, Kosbach and *Gerd Stransky*, Alzenau, all of Fed. Rep. of Germany. MAGNETIC SUSPENSION BEARING. Patent dated July 20, 1982. Disclaimer and Dedication filed Feb. 24, 1986, by the assignee, *Siemens Aktiengesellschaft*.

Hereby disclaims and dedicates to the public the entire term of said patent.
[*Official Gazette April 8, 1986.*]